US005930374A

United States Patent [19]

Werrbach et al.

[11] Patent Number: 5,930,374

[45] Date of Patent: Jul. 27, 1999

[54] PHASE COHERENT CROSSOVER

[75] Inventors: Donn R. Werrbach, Glendale; Richard W. Faith, Camarillo, both of Calif.

[73] Assignee: Aphex Systems, Ltd., Sun Valley, Calif.

[21] Appl. No.: 08/734,608

[22] Filed: Oct. 17, 1996

[51] Int. Cl.[6] .................... H03G 5/00

[52] U.S. Cl. .................... 381/99

[58] Field of Search .................... 381/98, 99, 100

[56] References Cited

U.S. PATENT DOCUMENTS

| | | | |
|---|---|---|---|
| 3,613,022 | 10/1971 | White et al. . | |
| 3,814,857 | 6/1974 | Thomasen . | |
| 4,100,371 | 7/1978 | Bayliff . | |
| 4,208,548 | 6/1980 | Orban . | |
| 4,495,643 | 1/1985 | Orban | 381/94.8 |
| 4,525,857 | 7/1985 | Orban . | |

*Primary Examiner*—Minsun Oh Harvey
*Attorney, Agent, or Firm*—Thomas I. Rozsa; Tony D. Chen; Jerry Fong

[57] ABSTRACT

The present invention phase coherent crossover incorporates a method and apparatus for providing phase coherent cross-over (PCC) signals. The PCC method and apparatus involve the utilizing of an all-pass filter for receiving an input signal and producing an all-pass signal, and a partial-pass filter also receiving the input signal and producing a partial-pass signal at a partial-pass output. The PCC method and apparatus further involve the combining of the partial-pass signal produced by the partial-pass filter with the all-pass signal produced by the all-pass filter to produce an opposite partial-pass signal at an opposite partial-pass output.

13 Claims, 8 Drawing Sheets

PHASE COHERENT CROSSOVER

BACKGROUND OF THE INVENTION

1. Field of the Invention

The present invention generally relates to the field of electronic circuitry. More particularly, the present invention relates to the field of crossover network circuitry.

2. Description of the Prior Art

The following six (6) prior art patents were uncovered in the pertinent field of the present invention:

1. U.S. Pat. No. 3,613,022 issued to White et al. on Oct. 12, 1971 for "Branching Circuit for Composite Electrical Signals" (hereafter "the White Patent");
2. U.S. Pat. No. 3,814,857 issued to Thomasen on Jun. 4, 1974 for "Two-Way Loudspeaker System With Two Tandem-connected High-Range Speakers" (hereafter "the Thomasen Patent");
3. U.S. Pat. No. 4,100,371 issued to Bayliff on Jul. 11, 1978 for "Loudspeaker System With Phase Difference Compensation" (hereafter "the Bayliff Patent");
4. U.S. Pat. No. 4,208,548 issued to Orban on Jun. 17, 1980 for "Apparatus And Method For Peak-Limiting Audio Frequency Signals" (hereafter "the '548 Orban Patent");
5. U.S. Pat. No. 4,495,643 issued to Orban on Jan. 22, 1985 for "Audio Peak Limiter Using Hilbert Transforms " (hereafter "the '643 Orban Patent"); and
6. U.S. Pat. No. 4,525,857 issued to Orban on Jun. 25, 1985 for "Crossover Network" (hereafter "the '857 Orban Patent").

The White Patent discloses a branching circuit for composite electrical signals. The composite electrical signals are connected to a unilateral phase-splitting circuit, a filter network and a differential amplifier. A first output signal from the phase splitter is applied to the input of the filter and to an input of the differential amplifier. The second output from the phase splitter, of opposite phase to the first output is applied to the other input of the differential amplifier. The branching circuit provides a first branched signal at the output terminals of the filter for signal components falling within the pass band of the filter and a second branched signal at the output of the differential amplifier for signal components falling within the stop band of the filter.

The Thomasen Patent discloses a two-way loudspeaker system with two tandem-connected high-range speakers. The high-frequency response and directional characteristics of a two-way loudspeaker system are improved by using two specially differential nearly identical high-frequency speakers both identically connected in parallel to a simple passive crossover network.

The Bayliff Patent discloses a loudspeaker system with a phase difference compensation. It comprises a crossover with a discrete active high-pass filter which is also fed to one input of a subtractor in order to derive low-pass characteristics from the high-pass filter. The loudspeaker system covers different but overlapping frequency ranges; a treble range and a bass range are mounted to radiate from co-planar mouths. Phase delay is introduced by the radiator for the lower range which is compensated by an acoustic delay disposed between the radiator of higher optimal frequency range and its mouth. The acoustic delay takes the form of an exponential horn which introduces a delay corresponding to the displacement.

The '548 Orban Patent discloses an apparatus and method for peak limiting audio frequency signals. The apparatus and method are used in systems employing high frequency pre-emphasis to compensate for steep high frequency rolloff in a receiver. The apparatus and method are useful in standard AM broadcasting to maximize loudness without noticeable distortion. The distortion caused by a clipper is determined by subtracting a clipper's output from its input.

The '643 Orban Patent discloses an audio peak limiter using Hilbert transforms. The limiter effectively provides radio frequency clipping of low frequencies and audio frequency clipping of high frequencies, and thereby little or no harmonic distortion occurs for voice whereas harmonic distortion is permitted for high frequency signals.

The '857 Orban Patent discloses a crossover network. It comprises a first shelving filter, a second shelving filter, a first low-pass filter, a second low-pass filter, a phase corrector and a subtracting means. The first shelving filter receives an audio signal. The second shelving filter is coupled to the output of the first shelving filter. The first low-pass filter is coupled to the output of the first shelving filter. The second low-pass filter and the phase corrector are coupled to the output of the second shelving filter. The subtracting means is used for subtracting two signals coupled to the output of the first and second low-pass filters, and the phase corrector. The band limited crossover network is produced with a high frequency band which is present at the output of the subtraction means and a low frequency band which is present at the output of the first low-pass filter.

In the field of audio there are numerous applications for frequency dividing circuits usually referred to as "Band Filters", "Crossover Networks", or simply, "Crossovers". For example, in the field of loudspeakers, crossovers are used to divide the audio frequencies between two or more acoustic drivers (e.g., woofer and tweeter). In these cases, the crossover may be a passive network built into the loudspeaker cabinets or an electronic means used in "bi-amped" or "tri-amped" systems. Signal processors also use crossover band filters in numerous ways. First order crossover filters are easy to construct and tune to the desired crossover frequency. However, first order band rejection is inadequate for many uses. Higher order crossover slopes are therefore sought after which can provide the needed band rejection and still produces a reasonably flat combined frequency response.

The major problem encountered with crossover filters or networks is obtaining a flat combined frequency response. Using conventional filters, it is impossible to obtain crossover responses that contain matching time responses, and the result is a non-flat frequency response near the crossover region. It is customary to offset the crossover filters somewhat to obtain a usable combined frequency response, but the unmatched phase response of the crossover filters can cause misdirection of the radiation pattern of loudspeaker arrays. A great deal of effort has been made to correct time errors in loudspeaker systems, much of it aimed at compensating for crossover problems, with only limited success. Obviously it would be useful to have a crossover filter which gives a relatively high order of crossover slope but which is perfectly timed matched at all frequencies.

An undesirable result of conventional loudspeaker crossovers is that their crossover point is usually found at only about −1 dB of amplitude when the combined frequency response is optimized. This causes amplifier power to be wasted by the two drivers because they are both at high drive levels for a relatively wide bandwidth either side of the crossover frequency. If the time response of the crossover filters were equal throughout the crossover transition, then the crossover point could be made to occur at −7 dB of amplitude and the combined power delivered to the drivers would be equal at all frequencies. Another advantages of obtaining a −6 dB crossover characteristic would be improved loudspeaker protection since less power would be driven to the speakers in the crossover region. It would obviously be desirable to have a crossover filter which yields a flat combined response with a crossover amplitude of −6 dB.

It would further be useful to have a crossover filter which is easy to construct and tune, and can be constructed from commonly available parts at a low cost.

It is therefore desirable to have a very effective design and construction of a phase coherent crossover making use of the known time response relationship between an all-pass filter and a low-pass filter in a manner which derives a high-pass filter output that is phase coherent with the low-pass filter, crosses the low-pass filter's response at −6 dB, and which can be summed with the low-pass filter output to reproduce a perfectly flat frequency response.

It is also desirable to have a very effective design and construction of a phase coherent crossover making use of the known time response relationship between an all-pass filter and a high-pass filter in a manner which derives a low-pass filter output that is phase coherent with the high-pass filter, crosses the high-pass filter's response at −6 dB, and which can be summed with the high-pass filter output to reproduce a perfectly flat a frequency response.

SUMMARY OF THE INVENTION

The present invention is a novel phase coherent crossover apparatus and method for deriving a high-pass output or low-pass output. In comparison with the prior art, the present invention provides a significant improvement in ease of design and tuning, and in performance cost.

One objective of the present invention is to create crossover filters of second order or greater which have equal time responses at all frequencies. Another objective of the present invention is to create crossover filters with a crossover amplitude of negative 6 dB. Yet another objective of the present invention is to create crossover filters which can be easily constructed from commonly available parts and at a low cost.

In one preferred embodiment of the present invention, the crossover network comprises two identical state-variable second-order filters each having low-pass, band-pass, and high-pass outputs. The first state variable filter is arranged to receive the input signal. The second state-variable filter is arranged to receive the low-pass output from the first state-variable filter. A summing amplifier is arranged to combine the low-pass, band-pass, and high-pass outputs from the first state-variable filter to produce an all-pass response. The low-pass output from the second state-variable filter represents a fourth-order response of the same corner frequency and Q as the all-pass response of the first state-variable filter. The low-pass output of the second state-variable filter is also fed to the summing amplifier. The phase and polarity relationships of the said output of the first and second state-variable filters create the effect of subtracting the fourth-order low-pass response from the second-order all-pass response to yield the desired fourth-order high-pass output response.

In another preferred embodiment of the present invention, the crossover network comprises two identical state-variable second-order filters each having low-pass, band-pass, and high-pass outputs. The first state variable filter is arranged to receive the input signal. The second state-variable filter is arranged to receive the high-pass output from the first state-variable filter. A summing amplifier is arranged to combine the low-pass, band-pass, and high-pass outputs from the first state-variable filter to produce an all-pass response. The high-pass output from the second state-variable filter represents a fourth-order response to the same corner frequency and Q as the all-pass response of the first state-variable filter. The high-pass output of the second state-variable filter is also fed to the summing amplifier. The phase and polarity relationships of the said outputs of first and second state-variable filters create the effect of subtracting the fourth-order high-pass response from the second-order all-pass response to yield the desired fourth-order low-pass output response.

To generalize the description, the phrases "partial-pass" filter and "opposite partial-pass" filter will be used. A "partial-pass" filter may be a high-pass filter or a low-pass filter. However, when the phrase "partial-pass" filter refers a high-pass filter, then the phrase "opposite partial-pass" filter used in the same context refers to a low-pass filter. Vise versa, when the phase "partial-pass" filter refers a low-pass filter, then the phrase "opposite partial-pass" filter used in the same context refers to a high-pass filter. In addition, the phrase "band-pass" means the frequency pass for the band frequencies between high frequencies and low frequencies.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
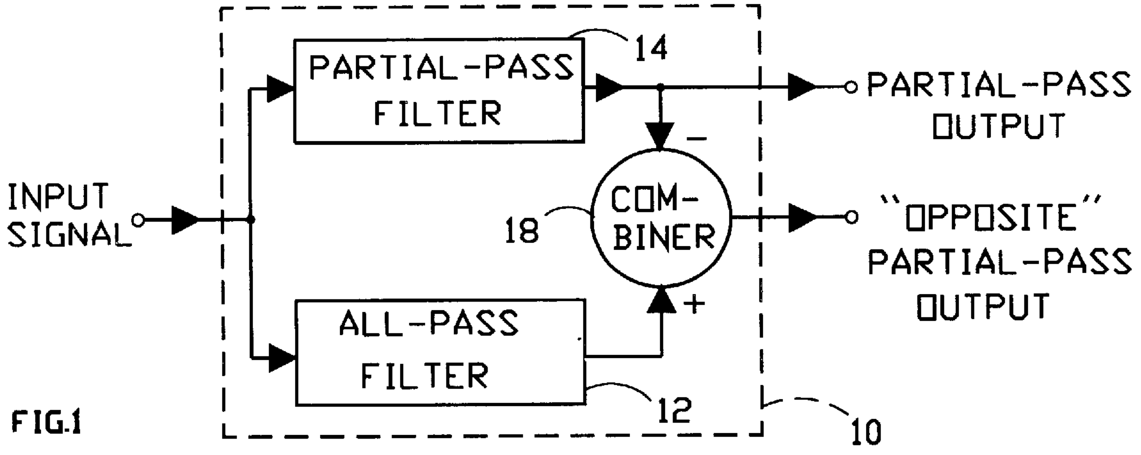
FIG. 1 is a simplified block diagram of the present invention phase coherent crossover.

Referring to FIG. 1, there is shown a simplified block diagram of the present invention phase coherent crossover (PCC). The PCC 10 has an input for receiving an input signal and two outputs: a "partial"-pass output and an "opposite" "partial"-pass output. As defined earlier, when the "partial-pass" output is a high-pass output, then the "opposite partial-pass" output is a low-pass output; Vise versa, when the "partial-pass" output is a low-pass output, then the "opposite partial-pass" output is a high-pass output. The PCC 10 comprises an all-pass filter 12, a "partial"-pass filter 14, and a combiner 18. The partial-pass filter 14 may be a low-pass filter or a high-pass filter, as shown in FIGS. 1A and 1B, respectively.

Figure 1A:
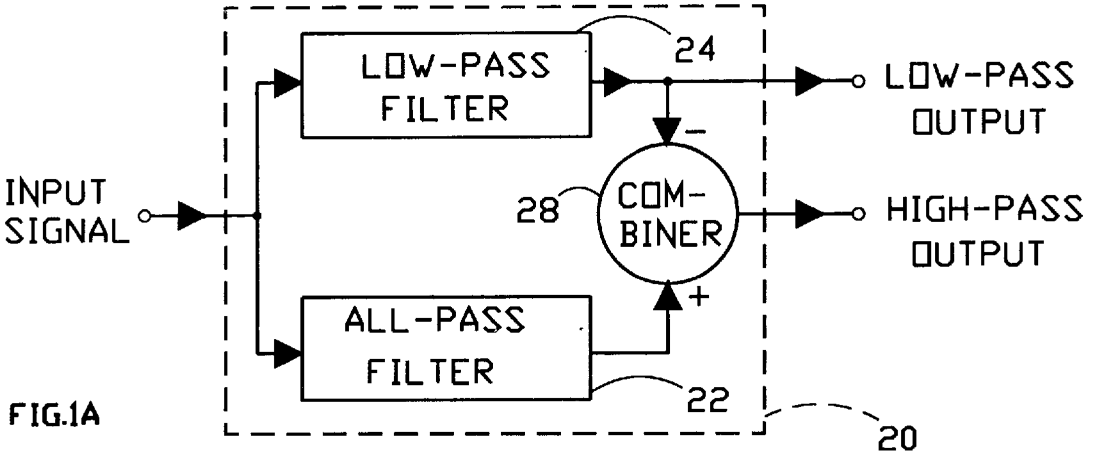
FIG. 1A is a simplified block diagram of the present invention phase coherent crossover utilizing a low-pass filter.

Referring to FIG. 1A, there is shown a simplified block diagram of the present invention phase coherent crossover utilizing a low-pass filter. The PCC 20 has an input for receiving an input signal and two outputs: a low-pass output and a high-pass output. The PCC 20 comprises an all-pass filter 22, a low-pass filter 24, and a combiner 28. The inputs of the all-pass filter 22 and the low-pass filter 24 are coupled to the input of the PCC 20 for receiving the input signal. The output signal of the low-pass filter 24, by definition of a low-pass filter, contains mainly the frequencies of the input signal which fall below the low-pass cutoff frequency. The output signal of the all-pass filter 22, by definition of an all-pass filter, contains all frequencies of the input signal including the low-pass filter's output frequencies. The all-pass filter 22 is designed to give a time delay to all frequencies approximately or exactly equal to the time delay of the low-pass filter 24's output frequencies. The combiner 28 has a positive(+) input, a negative (−) input, and an output. The output of the all-pass filter 22 is connected to the positive (+) input of combiner 28. The output of the low-pass filter 24 is connected to the negative (−) input of the combiner 28 and also to the low-pass output of the PCC 20. The combiner 28 is used for subtracting the low-pass filter 24 output signal from the all-pass filter 22 output signal to derive the phase coherent high-pass output of the PCC 20. The output of the all-pass filter 22 is coupled to the positive (+) input of the combiner 28. The output of the low-pass filter 24 is coupled to the negative (−) input of the combiner 28 and also to the low-pass output of the PCC 20. The combiner 28 is used for subtracting the low-frequency signal of the low-pass filter 24 from the output signal of the all-pass filter 22, so that only the high-frequency signal is produced at the output of the combiner 28.

Figure 1B:
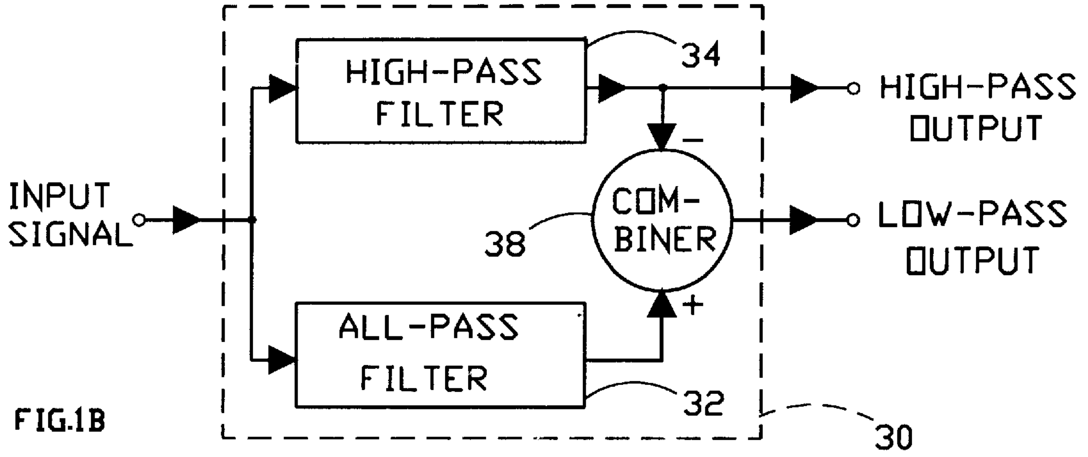
FIG. 1B is a simplified block diagram of the present invention phase coherent crossover utilizing a high-pass filter.

Referring to FIG. 1B, there is shown a simplified block diagram of the present invention phase coherent crossover utilizing a high-pass filter. The PCC 30 has an input for receiving an input signal and two outputs: a high-pass output and a low-pass output. The PCC 30 comprises an all-pass filter 32, a high-pass filter 34, and a combiner 38. The inputs of the all-pass filter 32 and the high-pass filter 34 are coupled to the input of the PCC 30 for receiving the input signal. The output signal of the high-pass filter, by definition of a high-pass filter, contains mainly the frequencies of the input signal which fall above the high-pass cutoff frequency. The output signal of the all-pass filter, by definition of an all-pass filter, contains all frequencies of the input signal including the high-pass filter's output frequencies. The all-pass filter is designed to give a time delay to all frequencies approximately or exactly equal to the time delay of the high-pass filter's output frequencies. The combiner 38 has a positive (+) input, a negative (−) input, and an output. The output of the all-pass filter 32 is connected to the positive (+) input of combiner 38. The output of the high-pass filter 34 is connected to the negative (31) input of the combiner 38 and also to the high-pass output of the PCC 30. The combiner 38 is used for subtracting the high-pass filter 34 output signal from the all-pass filter 32 output signal to derive the phase coherent low-pass output of the PCC 30. The combiner 38 is used for subtracting the high-frequency signal of the high-pass filter 34 from the output signal of the all-pass filter 32, so that only the low-frequency signal is produced at the output of the combiner 38.

Figure 2:
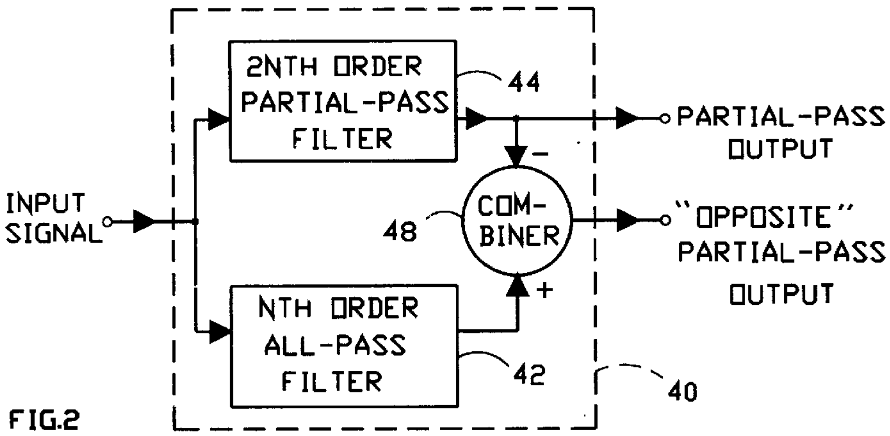
FIG. 2 is a simplified block diagram of the present invention phase coherent crossover comprising an Nth order all-pass filter and a (2N)th order "partial-pass" filter.

Referring to FIG. 2, there is a simplified block diagram of one embodiment of the present invention phase coherent crossover. The PCC 40 has an input for receiving an input signal and two outputs: a "partial"-pass output and an "opposite" "partial"-pass output. The PCC 40 comprises an Nth order all-pass filter 42, a (2N)th order "partial"-pass filter 44, and a combiner 48. As used in this application, the number N is an integer (N=1, 2, 3, . . . ). For example, the Nth order all-pass filter 42 may be a second-order all-pass filter. However, no matter what the order of the all-pass filter 42 is, there is always a 1:2 relationship between the order of the all-pass filter 42 and the "partial"-pass filter 44. For example, if the all-pass filter 42 is a second-order all-pass filter, then the "partial"-pass filter 44 is a fourth-order "partial"-pass filter. The (2N)th order "partial"-pass filter 44 may be a low-pass filter or a high-pass filter, as shown in FIGS. 2A and 2B, respectively.

Figure 2A:
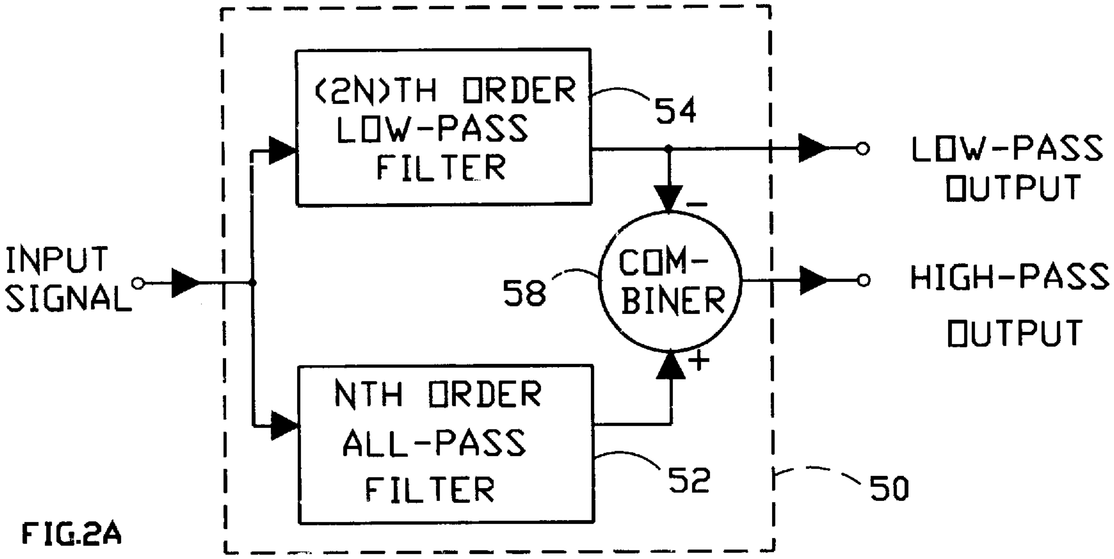
FIG. 2A is a simplified block diagram of the present invention phase coherent crossover comprising an Nth order all-pass filter and a (2N)th order low-pass filter.

Referring to FIG. 2A, there is shown a simplified block diagram of one embodiment of the present invention phase coherent crossover utilizing a low-pass filter. The PCC 50 comprises an Nth order all-pass filter 52, a (2N)th order low-pass filter 54, and a combiner 58. The output signal of the (2N)th order low-pass filter 54 is a (2N)th order response of the same corner frequency and Q-value as the Nth order response of the Nth order all-pass filter 52. At the combiner 58, the phase and polarity relationships of the output signals of the Nth order all-pass filter 52 and the (2N)th order low-pass filter 54 create the effect of subtracting the (2N)th order low-pass response from the Nth order all-pass response to yield the desired (2N)th order high-pass output.

Figure 2B:
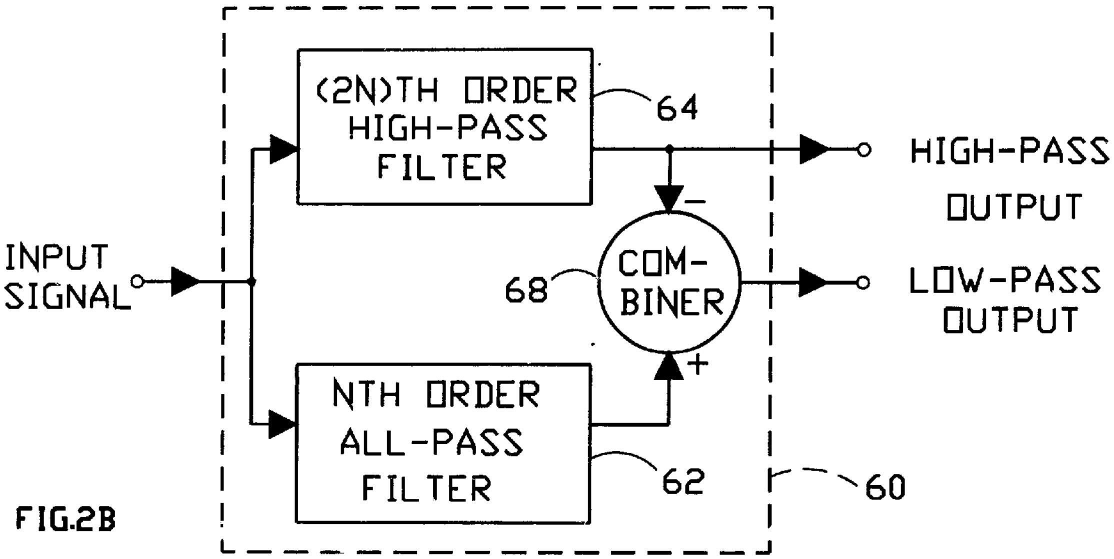
FIG. 2B is a simplified block diagram of the present invention phase coherent crossover comprising an Nth order all-pass filter and a (2N)th order high-pass filter.

Referring to FIG. 2B, there is shown a simplified block diagram of one embodiment of the present invention phase coherent crossover utilizing a high-pass filter. The PCC 60 comprises an Nth order all-pass filter 62, a (2N)th order high-pass filter 64, and a combiner 68. The output signal of the (2N)th order high-pass filter 64 is a (2N)th order response of the same corner frequency and Q-value as the Nth order response of the Nth order all-pass filter 62. At the combiner 68, the phase and polarity relationships of the output signals of the Nth order all-pass filter 62 and the (2N)th order high-pass filter 64 create the effect of subtracting the (2N)th order high-pass response from the Nth order all-pass response to yield the desired (2N)th order low-pass output.

Figure 3:
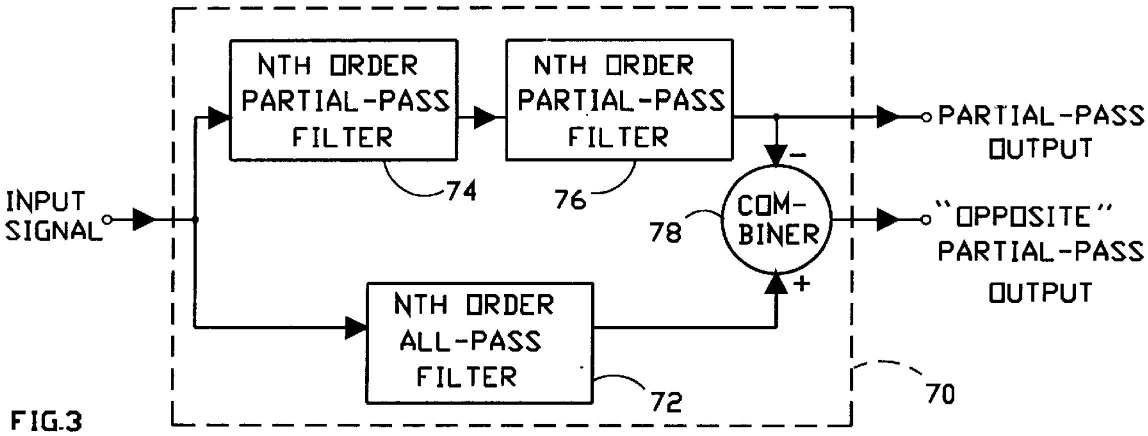
FIG. 3 is a simplified block diagram of the present invention phase coherent crossover comprising an Nth order all-pass filter and two Nth order "partial-pass" filters.

Referring to FIG. 3, there is shown a simplified block diagram of an alternative embodiment of the present invention phase coherent crossover. The PCC 70 has an input for receiving an input signal and two outputs: a "partial"-pass output and an "opposite" "partial"-pass output. The PCC 70 comprises an Nth order all-pass filter 72, two Nth order "partial"-pass filters 74 and 76, and a combiner 78. The two Nth order "partial"-pass filters 74 and 76 will achieve the same result as one (2N)th order "partial"-pass filter as shown in FIG. 2. The two Nth order "partial"-pass filters 74 and 76 may be two Nth order low-pass filters, or two Nth order high-pass filters, as shown in FIGS. 3A and 3B, respectively.

Figure 3A:
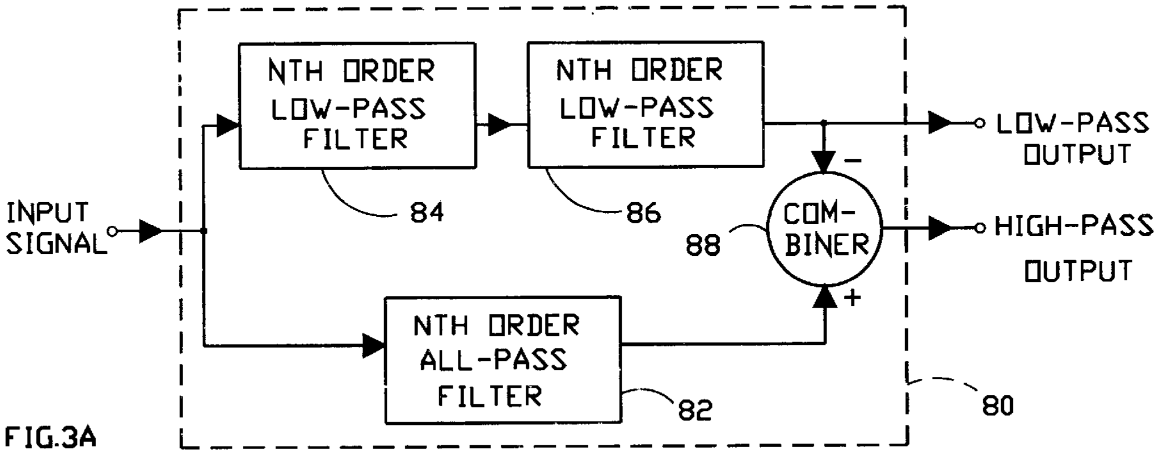
FIG. 3A is a simplified block diagram of the present invention phase coherent crossover comprising an Nth order all-pass filter and two Nth order low-pass filters.

Referring to FIG. 3A, there is shown a simplified block diagram of the alternative embodiment of the present invention phase coherent crossover utilizing two low-pass filters. The PCC 80 comprises an Nth order all-pass filter 82, two Nth order low-pass filters 84 and 86, and a combiner 88. The output signal of the first Nth order low-pass filter 84 is an Nth order response and is fed into the second Nth order low-pass filter 86. The output signal of the second low-pass filer 86 is a (2N)th order response of the same corner frequency and Q-value as the Nth order response of the Nth order all-pass filter 82. At the combiner 88, the phase and polarity relationships of the output signals of the Nth order all-pass filter 82 and the second Nth order low-pass filter 86 create the effect of subtracting the (2N)th order low-pass response from the Nth order all-pass response to yield the desired (2N)th order high-pass output.

Figure 3B:
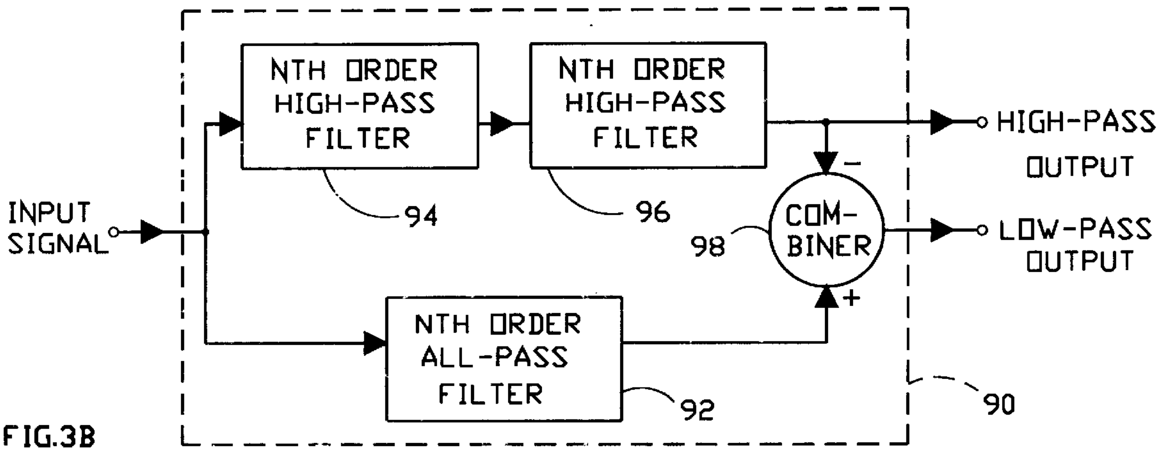
FIG. 3B is a simplified block diagram of the present invention phase coherent crossover comprising an Nth order all-pass filter and two Nth order high-pass filters.

Referring to FIG. 3B, there is shown a simplified block diagram of the alternative embodiment of the present invention phase coherent crossover utilizing two high-pass filters. The PCC 90 comprises an Nth order all-pass filter 92, two Nth order high-pass filters 94 and 96, and a combiner 98. The output signal of the first Nth order high-pass filter 94 is an Nth order response and is fed into the second Nth order high-pass filter 96. The output signal of the second high-pass filer 96 is a (2N)th order response of the same corner frequency and Q-value as the Nth order response of the Nth order all-pass filter 92. At the combiner 98, the phase and polarity relationships of the output signals of the Nth order all-pass filter 92 and the second Nth order high-pass filter 96 create the effect of subtracting the (2N)th order high-pass response from the Nth order all-pass response to yield the desired (2N)th order low-pass output.

Figure 4:
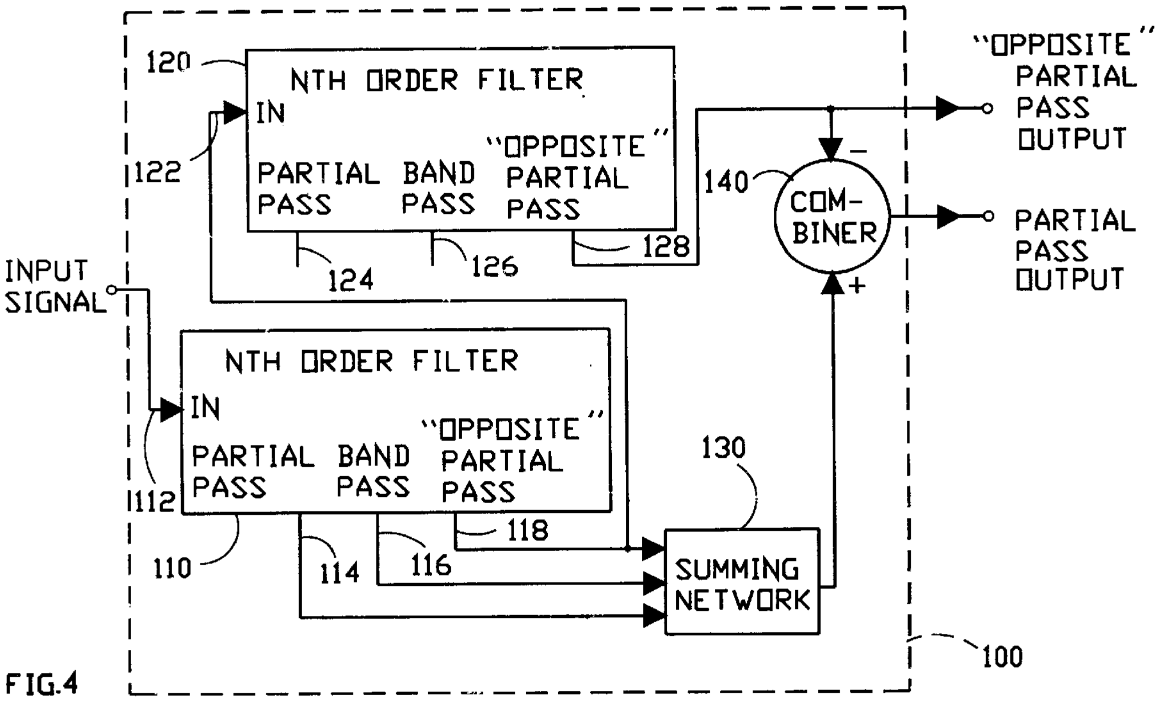
FIG. 4 is a block diagram representing the preferred embodiments of the present invention phase coherent crossover comprising two identical Nth order filters each having a partial-pass output, a band-pass output, and an "opposite" partial-pass output.

Referring to FIG. 4, there is shown a block diagram representing the preferred embodiments of the present invention phase coherent crossover. The PCC 100 comprises two identical Nth order filters 110 and 120, a summing network 130, and a combiner 140. The first Nth order filter 110 has an input 112, a partial-pass output 114, a band-pass output 116, and an "opposite" partial-pass output 118. The second Nth order filter 120 has an input 122, a partial-pass output 124, a band-pass output 126, and an "opposite" partial-pass output 128. The output signals from the partial-pass output 114, the band-pass output 116 and the "opposite" partial-pass output 118 are summarized by summing network 130 which yields an Nth order response. The output signal from the "opposite" partial-pass output 118 of the first Nth order filter 110 is an Nth order response which is fed into the input 122 of the second Nth order filter 120. Therefore, the output signal from the "opposite" partial-pass output 128 of the second Nth order filter 120 is a (2N)th order response of the same corner frequency and Q-value as the Nth order response produced by the summing network 130. At the combiner 140, the phase and polarity relationships of the summarized output signals of the Nth order filter 110 and the (2N)th order output signal of the second Nth order filter 120 create the effect of subtracting the (2N)th order response from the Nth order response to yield the desired (2N)th order partial-frequency output. The (2N)th order response can be either a low-pass response or a high-pass response, depending on the circuitry design, as shown in FIGS. 4A and 4B.

Figure 4A:
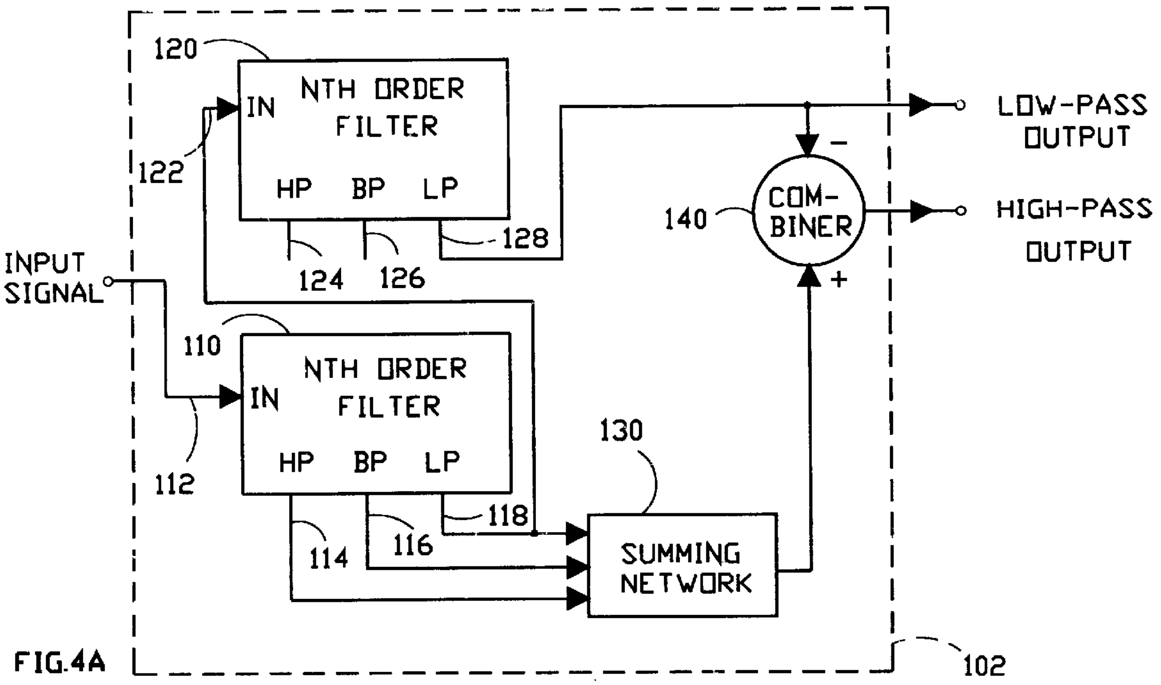
FIG. 4A is a block diagram of one preferred embodiment of the present invention phase coherent crossover comprising two identical Nth order filters each having a low-pass output, a band-pass output, and a high-pass output, where the low-pass output from the second Nth order filter represents a (2N)th order low-pass output.

Referring to FIG. 4A, there is shown a block diagram of a preferred embodiment of the present invention phase coherent crossover. In this embodiment, the output signal from the low-pass output 118 of the first Nth order filter 110 is an Nth order low pass response which is fed into the input 122 of the second Nth order filter 120. Therefore, the output signal from the low-pass output 128 of the second Nth order filter 120 is a (2N)th order low-frequency response of the same corner frequency and Q-value as the Nth order all-pass response produced by the summing network 130. At the combiner 140, the phase and polarity relationships of the summarized all-pass output signals of the Nth order filter 110 and the (2N)th order low-frequency output signal of the second Nth order filter 120 create the effect of subtracting the (2N)th order low-pass response from the Nth order all-pass response to yield the desired (2N)th order high-pass output.

Figure 4B:
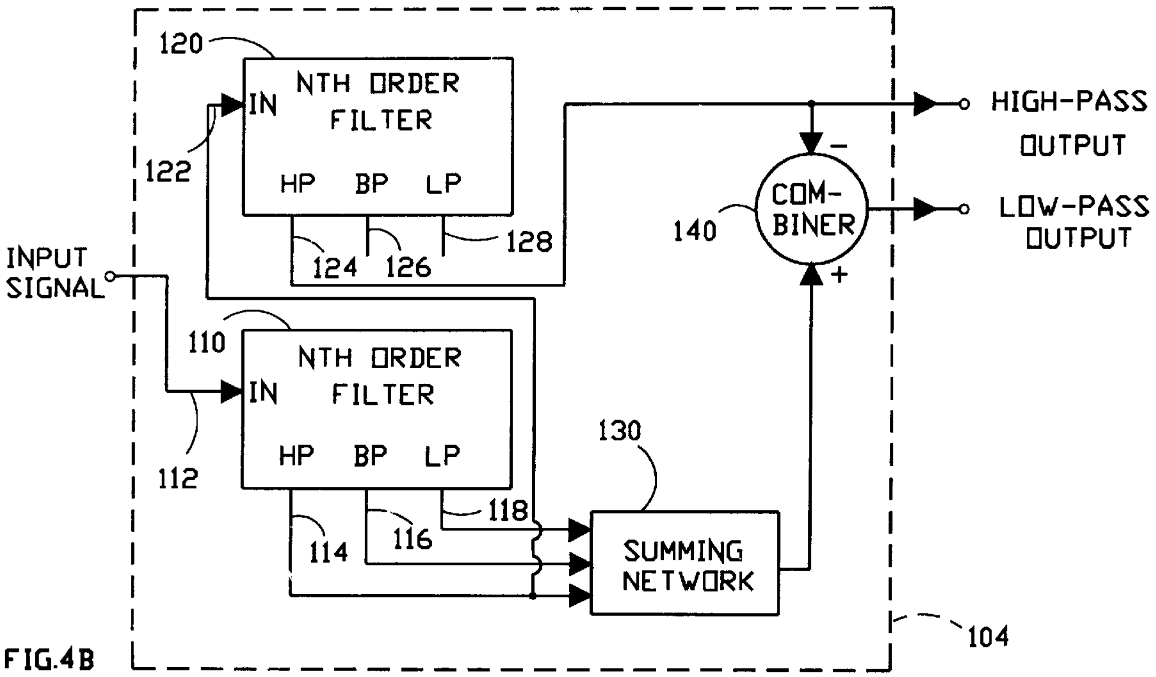
FIG. 4B is a block diagram of another preferred embodiment of the present invention phase coherent crossover comprising two identical Nth order filters each having a low-pass output, a band-pass output, and a high-pass output, where the high-pass output from the second Nth order filter represents a (2N)th order high-pass output.

Referring to FIG. 4B, there is shown a block diagram of a preferred alternative embodiment of the present invention phase coherent crossover. In this alternative embodiment, the output signal from the high-pass output 118 of the first Nth order filter 110 is an Nth order high pass response which is fed into the input 122 of the second Nth order filter 120. Therefore, the output signal from the high-pass output 128 of the second Nth order filter 120 is a (2N)th order high-frequency response of the same corner frequency and Q-value as the Nth order all-pass response produced by the summing network 130. At the combiner 140, the phase and polarity relationships of the summarized all-pass output signals of the Nth order filter 110 and the (2N)th order high-frequency output signal of the second Nth order filter 120 create the effect of subtracting the (2N)th order high-pass response from the Nth order all-pass response to yield the desired (2N)th order low-pass output.

Figure 5:
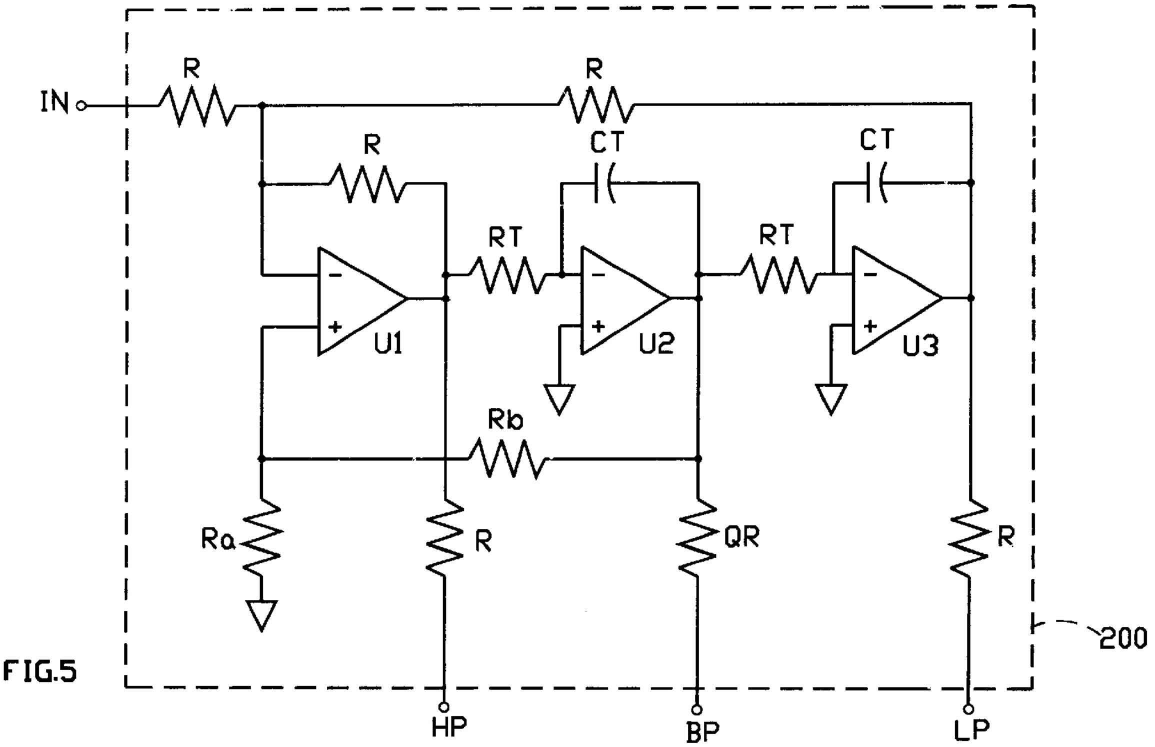
FIG. 5 is a detailed schematic diagram of a second-order filter having a high-pass output, a band-pass output, and a low-pass output, which is utilized in the preferred embodiments of the present invention phase coherent crossover.

FIG. 5 is a detailed schematic diagram of a sample filter which can be utilized in practicing the present invention phase coherent crossover. Filter 200 is a state-variable second-order filter having an input "IN", a high-pass output "HP", a band-pass output "BP", and a low-pass output "LP". U1, U2 and U3 are three operational-amplifier (op-amp) state-variable sections. By way of example only, type LF347 op-amps may be utilized. Also provided as examples only: resistors R may be 10 KΩ, resistors RT may be 5 KΩ, and resistors QR may be 14.1 KΩ; capacitors CT should have 10 KΩ≦Xc≦200 KΩ at resonant frequency; the Q-value may be approximately 0.70710678; the parallel-equivalent value of resistors Ra and Rb should be approximately Ra=R/3, and Rb=Ra(3 Q−1).

Figure 5A:
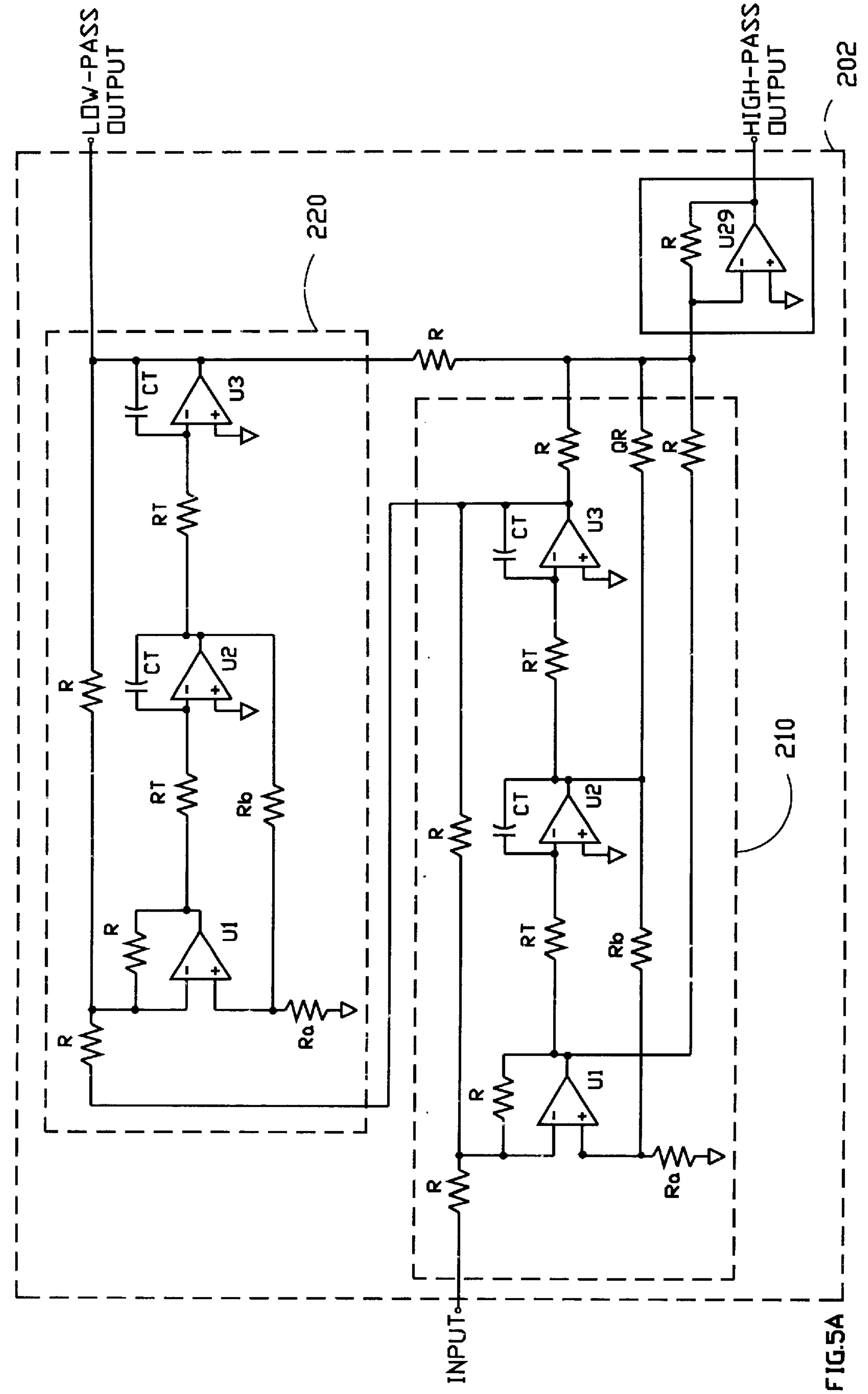
FIG. 5A is a detailed schematic diagram of one preferred embodiment of the present invention phase coherent crossover comprising two identical second-order filters each having a low-pass output, a band-pass output, and a high-pass output, where the low-pass output from the second second-order filter represents a fourth order low-pass output.

Referring to FIG. 5A, there is shown a detailed schematic diagram of the preferred embodiment of the present invention phase coherent crossover. The PCC 202 shown therein has the same circuit design as depicted in FIG. 4A with the utilization of the state-variable second-order filter depicted in FIG. 5. In this embodiment, the output signal from the low-pass output of the first second-order filter 210 is a second-order low pass response which is fed into the input of the second second-order filter 220. Therefore, the output signal from the low-pass output of the second second-order filter 220 is a fourth-order low pass response of the same corner frequency and Q-value as the second-order all-pass response of the first second-order filter 210. The phase and polarity relationships of the second-order all-pass response of the first second-order filter 210 and the fourth-order low-pass response of the second second-order filter 220 create the effect of subtracting the fourth-order low-pass response from the second-order all-pass response to yield the desired fourth-order high-pass output.

Figure 5B:
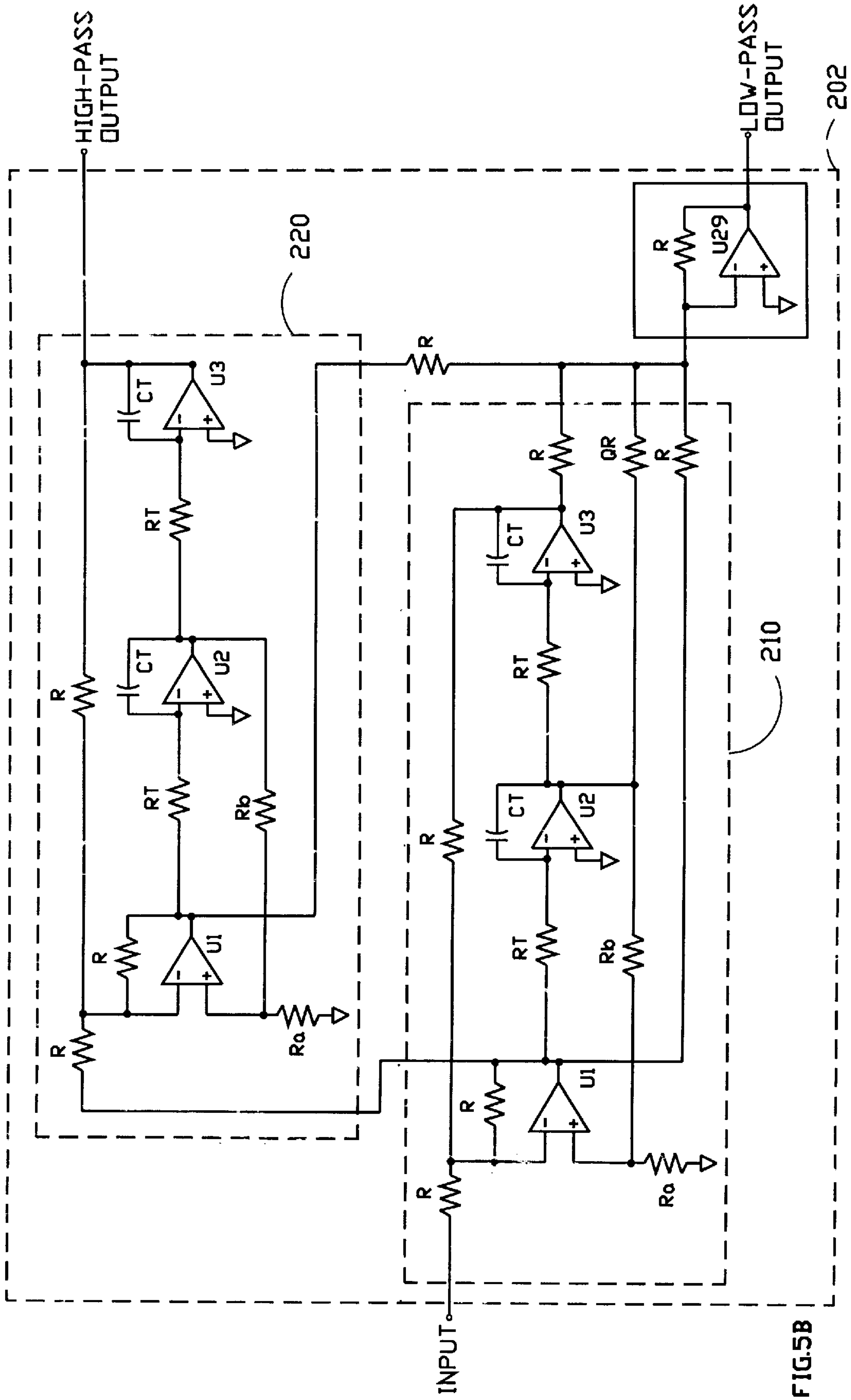
FIG. 5B is a detailed schematic diagram of another preferred embodiment of the present invention phase coherent crossover comprising two identical second-order filters each having a low-pass output, a band-pass output, and a high-pass output, where the high-pass output from the second second-order filter represents a fourth order high-pass output.

Referring to FIG. 5B, there is shown a detailed schematic diagram of the preferred alternative embodiment of the present invention phase coherent crossover. The PCC 204 shown therein has the same circuit design as depicted in FIG. 4B with the utilization of the state-variable second-order filter depicted in FIG. 5. In this alternative embodiment, the output signal from the high-pass output of the first second-order filter 210 is a second-order high pass response which is fed into the input of the second second-order filter 220. Therefore, the output signal from the high-pass output of the second second-order filter 220 is a fourth-order high pass response of the same corner frequency and Q-value as the second-order all-pass response of the first second-order filter 210. The phase and polarity relationships of the second-order all-pass response of the first second-order filter 210 and the fourth-order high-pass response of the second second-order filter 220 create the effect of subtracting the fourth-order high-pass response from the second-order all-pass response to yield the desired fourth-order low-pass output.

Defined generally, the present invention is a phase coherent crossover (PCC), comprising: (a) an input for receiving an input signal, a partial-pass output, and an opposite partial-pass output; (b) an all-pass filter receiving the input signal, and producing an all-pass signal; (c) a partial-pass filter also receiving the input signal, and producing a partial-pass signal at the partial-pass output; and (d) a combiner combining the partial-pass signal produced by the partial-pass filter with the all-pass signal produced by the all-pass filter, and producing an opposite partial-pass signal at the opposite partial-pass output.

Defined in detail, the present invention is a phase coherent crossover (PCC), comprising: (a) an input for receiving an input signal, a partial-pass output, and an opposite partial-pass output; (b) an Nth order all-pass filter receiving the input signal, and producing an Nth order all-pass signal, where N is an integer; (c) a (2N)th order partial-pass filter also receiving the input signal, and producing a (2N)th order partial-pass signal at the partial-pass output; and (d) a combiner combining the (2N)th order partial-pass signal produced by the (2N)th order partial-pass filter with the Nth order all-pass signal produced by the Nth order all-pass filter, and producing a (2N)th order opposite partial-pass signal at the opposite partial-pass output.

Defined alternatively in detail, the present invention is a phase coherent crossover (PCC), comprising: (a) an input for receiving an input signal, a partial-pass output, and an opposite partial-pass output; (b) an Nth order all-pass filter receiving the input signal, and producing an Nth order all-pass signal, where N is an integer; (c) a first Nth order partial-pass filter also receiving the input signal, and producing an Nth order partial-pass signal; (d) a second Nth order partial-pass filter receiving the Nth order partial-pass signal, and producing a (2N)th order partial-pass signal at the partial-pass output; and (e) a combiner combining the (2N)th order partial-pass signal produced by the second Nth order partial-pass filter with the Nth order all-pass signal produced by the Nth order all-pass filter, and producing a (2N)th order opposite partial-pass signal at the opposite partial-pass output.

Defined further alternatively in detail, the present invention is a phase coherent crossover (PCC), comprising: (a) an input for receiving an input signal, a partial-pass output, and an opposite partial-pass output; (b) a first Nth order all-pass filter receiving the input signal, and producing an Nth order all-pass signal which contains an Nth order partial-pass signal, where N is an integer; (c) a second Nth order all-pass filter receiving Nth order partial-pass signal, and producing a (2N)th order partial-pass signal at the partial-pass output; and (d) a combiner combining the (2N)th order partial-pass signal produced by the second Nth order all-pass filter with the Nth order all-pass signal produced by the first Nth order all-pass filter, and producing a (2N)th order opposite partial-pass signal at the opposite partial-pass output.

This invention is also a method of producing phase coherent crossover signals.

Alternatively defined in general, the present invention is a method for producing phase coherent crossover signals, comprising the steps of: (a) providing an all-pass filter for receiving an input signal, and producing an all-pass signal; (b) providing a partial-pass filter also for receiving the input signal, and producing a partial-pass signal; and (c) combining the partial-pass signal produced by the partial-pass filter with the all-pass signal produced by the all-pass filter to produce an opposite partial-pass signal.

Alternatively defined in detail, the present invention is a method for producing phase coherent crossover signals, comprising the steps of: (a) providing an Nth order all-pass filter for receiving an input signal, and producing an Nth order all-pass signal, where N is an integer; (b) providing a (2N)th order partial-pass filter also for receiving the input signal, and producing a (2N)th order partial-pass signal; and (c) combining the (2N)th order partial-pass signal produced by the (2N)th order partial-pass filter with the Nth order all-pass signal produced by the Nth order all-pass filter, to produce a (2N)th order opposite partial-pass signal.

Alternatively defined also in detail, the present invention is a method for producing phase coherent crossover signals, comprising the steps of: (a) providing an Nth order all-pass filter for receiving an input signal, and producing an Nth order all-pass signal, where N is an integer; (b) providing a first Nth order partial-pass filter also for receiving the input signal, and producing an Nth order partial-pass signal; (c) providing a second Nth order partial-pass filter for receiving the Nth order partial-pass signal, and producing a (2N)th order partial-pass signal; and (d) combining the (2N)th order partial-pass signal produced by the second Nth order partial-pass filter with the Nth order all-pass signal produced by the Nth order all-pass filter, to produce a (2N)th order opposite partial-pass signal.

Alternatively defined again in detail, the present invention is a method for producing phase coherent crossover signals, comprising the steps of: (a) providing a first Nth order all-pass filter receiving an input signal, and producing an Nth order all-pass signal which contains an Nth order partial-pass signal, where N is an integer; (b) providing a second Nth order all-pass filter receiving Nth order partial-pass signal, and producing a (2N)th order partial-pass signal at the partial-pass output; and (c) combining the (2N)th order partial-pass signal produced by the second Nth order all-pass filter with the Nth order all-pass signal produced by the first Nth order all-pass filter, to produce a (2N)th order opposite partial-pass signal at the opposite partial-pass output.

Alternatively defined further in detail, the present invention is a method for producing phase coherent crossover signals, comprising the steps of: (a) providing a first Nth order filter for receiving an input signal and producing both an Nth order all-pass signal and an Nth order partial-pass signal; (b) providing a second Nth order partial-pass filter for receiving said Nth order partial-pass signal from said first Nth order filter and producing a (2N)th order partial-pass output signal; and (c) combining said (2N)th order partial-pass signal produced by said second Nth order partial-pass filter with said Nth order all-pass signal produced by said first Nth order filter to produce a (2N)th order opposite partial-pass signal.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A phase coherent crossover (PCC), comprising:

a. an input for receiving an input signal, a partial-pass output, and an opposite partial-pass output;

b. an Nth order all-pass filter receiving said input signal, and producing an Nth order all-pass signal, where N is an integer;

c. A (2N)th order partial-pass filter also receiving said input signal, and producing a (2N)th order partial-pass signal at said partial-pass output; and d. a combiner combining said (2N)th order partial-pass signal produced by said (2N)th order partial-pass filter with said Nth order all-pass signal produced by said Nth order all-pass filter, and producing a (2N)th order opposite partial-pass signal at said opposite partial-pass output.

2. The phase coherent crossover (PCC) as defined in claim 1, wherein:

a. said (2N)th order partial-pass filter is a (2N)th order low-pass filter;

b. said (2N)th order partial-pass signal is a (2N)th order low-pass signal; and c. said (2N)th order opposite partial-pass signal is a (2N)th order high-pass signal.

3. The phase coherent crossover (PCC) as defined in claim 1, wherein:

a. said (2N)th order partial-pass filter is a (2N)th order high-pass filter;

b. said (2N)th order partial-pass signal is a (2N)th order high-pass signal; and c. said (2N)th order opposite partial-pass signal is a (2N)th order low-pass signal.

4. A phase coherent crossover (PCC), comprising:

a. an input for receiving an input signal, a partial-pass output, and an opposite partial-pass output;

b. an Nth order all-pass filter receiving said input signal, and producing an Nth order all-pass signal, where N is an integer;

c. a first Nth order partial-pass filter also receiving said input signal, and producing an Nth order partial-pass signal;

d. a second Nth order partial-pass filter receiving said Nth order partial-pass signal, and producing a (2N)th order partial-pass signal at said partial-pass output; and e. a combiner combining said (2N)th order partial-pass signal produced by said second Nth order partial-pass filter with said Nth order all-pass signal produced by said Nth order all-pass filter, and producing a (2N)th order opposite partial-pass signal at said opposite partial-pass output.

5. The phase coherent crossover (PCC) as defined in claim 4 wherein:

a. said first and second Nth order partial-pass filter are Nth order low-pass filters;

b. said Nth order partial-pass signal is an Nth order low-pass signal;

c. said (2N)th order partial-pass signal is a (2N)th order low-pass signal; and d. said (2N)th order opposite partial-pass signal is a (2N)th order high-pass signal.

6. The phase coherent crossover (PCC) as defined in claim 4, wherein:

a. said first and second Nth order partial-pass filter are Nth order high-pass filters;

b. said Nth order partial-pass signal is an Nth order high-pass signal;

c. said (2N)th order partial-pass signal is a (2N)th order high-pass signal; and d. said (2N)th order opposite partial-pass signal is a (2N)th order low-pass signal.

7. A phase coherent crossover (PCC), comprising:

a. an input for receiving an input signal, a partial-pass output, and an opposite partial-pass output;

b. a first Nth order all-pass filter receiving said input signal, and producing an Nth order all-pass signal which contains an Nth order partial-pass signal, where N is an integer;

c. a second Nth order all-pass filter receiving Nth order partial-pass signal, and producing a (2N)th order partial-pass signal at said partial-pass output; and d. a combiner combining said (2N)th order partial-pass signal produced by said second Nth order all-pass filter with said Nth order all-pass signal produced by said first Nth order all-pass filter, and producing a (2N)th order opposite partial-pass signal at said opposite partial-pass output.

8. The phase coherent crossover (PCC) as defined in claim 7, wherein:

a. said Nth order partial-pass signal in an Nth order low-pass signal; and b. said (2N)th order partial-pass signal is a (2N)th order low-pass signal; and c. said (2N)th order opposite partial-pass signal is a (2N)th order high-pass signal.

9. The phase coherent crossover (PCC) as defined in claim 7, wherein:

a. said Nth order partial-pass signal is an Nth order high-pass signal; and b. said (2N)th order partial-pass signal is a (2N)th order high-pass signal; and c. said (2N)the order opposite partial-pass signal is a (2N)th order low-pass signal.

10. A method for producing phase coherent crossover signals, comprising the steps of:

a. providing an Nth order all-pass filter for receiving an input signal, and producing an Nth order all-pass signal, where N is an integer;

b. providing a (2N)th order partial-pass filter also for receiving said input signal, and producing a (2N)th order partial-pass signal; and c. combining said (2N)th order partial-pass signal produced by said (2N)th order partial-pass filter with said Nth order all-pass signal produced by said Nth order all-pass filter, to produce a (2N)th order opposite partial-pass signal.

11. A method for producing phase coherent crossover signals, comprising the steps of:

a. providing an Nth order all-pass filter for receiving an input signal, and producing an Nth order all-pass signal, where N is an integer;

b. providing a first Nth order partial-pass filter also for receiving said input signal, and producing an Nth order partial-pass signal;

c. providing a second Nth order partial-pass filter for receiving said Nth order partial-pass signal, and producing a (2N)th order partial-pass signal; and d. combining said (2N)th order partial-pass signal produced by said second Nth order partial-pass filter with said Nth order all-pass signal produced by said Nth order all-pass filter, to produce a (2N)th order opposite partial-pass signal.

12. A method for producing phase coherent crossover signals, comprising the steps of:

a. providing a first Nth order all-pass filter receiving an input signal, and producing an Nth order all-pass signal which contains an Nth order partial-pass signal, where N is an integer;

b. providing a second Nth order all-pass filter receiving Nth order partial-pass signal, and producing a (2N)th order partial-pass signal at said partial-pass output; and c. combining said (2N)th order partial-pass signal produced by said second Nth order all-pass filter with said Nth order all-pass signal produced by said first Nth order all-pass filter, to produce a (2N)th order opposite partial-pass signal at said opposite partial-pass output.

13. A method for producing phase coherent crossover signals, comprising the steps of:

a. providing a first Nth order filter for receiving an input signal and producing both an Nth order all-pass signal and an Nth order partial-pass signal;

b. providing a second Nth order partial-pass filter for receiving said Nth order partial-pass signal from said first Nth order filter and producing a (2N)th order partial-pass output signal; and c. combining said (2N)th order partial-pass signal produced by said second Nth order partial-pass filter with said Nth order all-pass signal produced by said first Nth order filter to produce a (2N)th order opposite partial-pass signal.

* * * * *